(12) United States Patent
Liikanen et al.

(10) Patent No.: US 12,125,539 B2
(45) Date of Patent: Oct. 22, 2024

(54) ADJUSTMENT OF A STARTING VOLTAGE CORRESPONDING TO A PROGRAM OPERATION IN A MEMORY SUB-SYSTEM

(71) Applicant: MICRON TECHNOLOGY, INC., Boise, ID (US)

(72) Inventors: Bruce A. Liikanen, Berthoud, CO (US); Michael Sheperek, Longmont, CO (US); Larry J. Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 17/861,467

(22) Filed: Jul. 11, 2022

(65) Prior Publication Data

US 2022/0343981 A1 Oct. 27, 2022

Related U.S. Application Data

(63) Continuation of application No. 16/885,977, filed on May 28, 2020, now Pat. No. 11,393,534.

(51) Int. Cl.
*G11C 16/10* (2006.01)
*G06F 3/06* (2006.01)
*G11C 16/04* (2006.01)

(52) U.S. Cl.
CPC ............ *G11C 16/10* (2013.01); *G06F 3/0604* (2013.01); *G06F 3/0659* (2013.01); *G06F 3/0679* (2013.01); *G11C 16/0483* (2013.01)

(58) Field of Classification Search
CPC . G11C 16/10; G11C 16/0483; G11C 11/5628; G06F 3/0604; G06F 3/0659; G06F 3/0679
See application file for complete search history.

(56) References Cited

U.S. PATENT DOCUMENTS

| | | | |
|---|---|---|---|
| 11,061,768 B1 | 7/2021 | Alrod et al. | |
| 2010/0195387 A1 | 8/2010 | Park | |
| 2012/0140558 A1 | 6/2012 | Matsunami | |
| 2016/0019948 A1 | 1/2016 | Pang et al. | |
| 2016/0111148 A1 | 4/2016 | Wong | |
| 2016/0293271 A1* | 10/2016 | Won | G11C 29/12005 |
| 2016/0329103 A1 | 11/2016 | Watanabe | |
| 2018/0102790 A1* | 4/2018 | Oh | H03M 13/05 |
| 2018/0277229 A1* | 9/2018 | Takizawa | G11C 16/3445 |

(Continued)

*Primary Examiner* — Khoa D Doan
*Assistant Examiner* — Tong B. Vo
(74) *Attorney, Agent, or Firm* — LOWENSTEIN SANDLER LLP

(57) ABSTRACT

A processing device determines a measured bit error count (BEC) value corresponding to a read sample offset operation executed on a first programming voltage distribution of memory cells of a plurality of programming voltage distributions of a memory sub-system. The measured BEC value of the portion of the programming voltage distribution is compared to a threshold BEC value to generate a comparison result. In view of the comparison result, an adjusted program start voltage level is determined by adjusting a default program voltage level of a programming process. The programming process including a series of programming pulses is executed, where the adjusted program start voltage level is set as a starting voltage level of a first programming pulse of the series of programming pulses.

20 Claims, 8 Drawing Sheets

(56) References Cited

U.S. PATENT DOCUMENTS

| | | |
|---|---|---|
| 2019/0115078 A1* | 4/2019 | Kim .................... G11C 16/3445 |
| 2019/0304543 A1 | 10/2019 | Sule et al. |
| 2020/0066355 A1 | 2/2020 | Papandreou et al. |
| 2020/0098439 A1* | 3/2020 | Park ...................... G11C 16/107 |
| 2020/0117536 A1* | 4/2020 | Lu ........................ G06F 11/1048 |
| 2020/0160925 A1 | 5/2020 | Lin |
| 2021/0065815 A1* | 3/2021 | Lee ..................... G06F 11/1012 |
| 2021/0141564 A1 | 5/2021 | Shin |
| 2021/0295931 A1* | 9/2021 | Takada ................ G06F 11/1068 |
| 2021/0383879 A1* | 12/2021 | Lin ........................ G11C 16/26 |

* cited by examiner

ADJUSTMENT OF A STARTING VOLTAGE CORRESPONDING TO A PROGRAM OPERATION IN A MEMORY SUB-SYSTEM

CROSS-REFERENCE TO RELATED APPLICATION

This application is a continuation of U.S. patent application Ser. No. 16/885,977, filed on May 28, 2020, the entirety of which is hereby incorporated by reference herein.

TECHNICAL FIELD

Embodiments of the disclosure relate generally to memory sub-systems, and more specifically, relate to adjustment of a starting voltage corresponding to a programming process in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
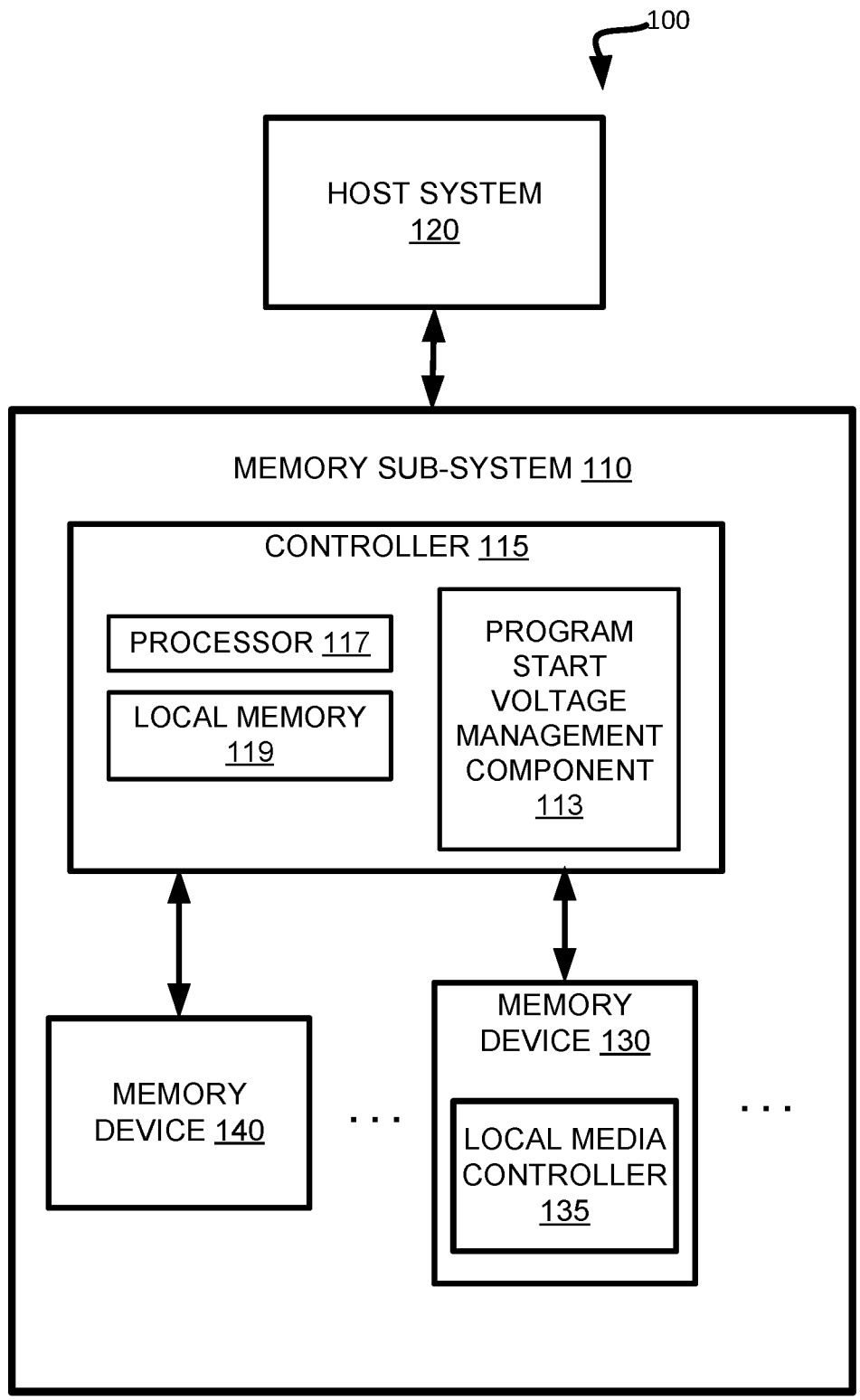
FIG. 1 illustrates an example computing environment that includes a memory sub-system in accordance with some embodiments of the disclosure.

Aspects of the present disclosure are directed to adjustment of a starting voltage corresponding to a programming process in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include multiple memory components that can store data from the host system in accordance with multiple programming voltage distributions. A calibration operation (e.g., a continuous read level calibration (cRLC) operation) can be executed to continuously sample margins between programming voltage distributions, also referred to as read threshold valleys or valleys. Conventional memory sub-systems can perform the calibration using a read sample offset (RSO) operation in which multiple reads are performed at varying offsets, generally referred to as left, right, and center samples or probes, to read the data of the memory sub-system. Each of these reads is of the same data and each returns a bit error count (BEC) associated with the data. Placement of the RSO probes relative to the valleys of the programming voltage distributions can impact the quality of the sampling.

Conventional memory sub-systems program or write data values using threshold voltages in a number of memory cells. A programming operation can be executed by applying a wordline bias voltage to word lines to which memory cells of a selected page are connected. For example, an Incremental Step Pulse Programming (ISPP) process or scheme can be employed to maintain a tight cell threshold voltage distribution for higher data reliability. In ISPP, a series of high-amplitude programming pulses of increasing magnitude (e.g., by a predefined pulse step height) are applied to one or more memory cells to gradually raise the threshold voltage of the memory cells to above a threshold level (referred to as a "program verify threshold level"). A program targeting (PT) operation controls the program verify threshold level (e.g., a threshold voltage (Vt)) placement such that the programming voltage distributions are placed in a beneficial arrangement (e.g., with a desired distribution of memory cells in each programming voltage distribution level corresponding to a program state).

In the ISPP process, following each pulse, a program verify operation is performed to compare a pulse value (e.g., the applied threshold voltage) to the program verify threshold level. Since memory cells in conventional systems can have different threshold voltages, multiple pulse-verify iterations are performed until the applied threshold voltage of a pulse reaches and exceeds the program verify threshold level. The programming time (also referred to as "tProg") is measured as a time from an initial pulse (e.g., at a start program voltage value) until the program verify threshold level is reached (e.g., the amount of time it takes to perform the pulse-verify iterations.

In conventional systems, if an initial threshold voltage value (e.g., the magnitude of the first pulse) of the ISPP operation is set too low relative to the program verify threshold level, a high number of pulse-verify increments are needed to reach the program verify threshold level. This results in excessive program times and reduced write performance. Alternatively, if the initial threshold voltage value is set too high, a portion of the memory cells targeted for a first programmed distribution can overshoot a target program verify threshold level, resulting in an undesirable wide programming voltage distribution and reduced read threshold valleys.

Furthermore, various conventional techniques performed in the memory device (e.g., a start voltage management technique such as an automatic dynamic wordline start voltage (ADWLSV) technique) to determine a programming start voltage for a first memory sub-block. The conventional technique then applies the same programming start voltage determined for the first sub-block to all of the subsequent sub-blocks on the wordline. This, however, results in inconsistent and non-uniform programming times and fails to account for the differences between the first memory sub-block and the subsequent sub-blocks associated with the wordline.

Aspects of the present disclosure address the above and other deficiencies by adjusting a program start voltage during a programming process to maintain a threshold amount or level of programming overshoot (e.g., an amount of memory cells targeted for a programming voltage distribution that overshoot the corresponding program verify threshold). According to embodiments, an RSO operation is performed with respect to a first programming voltage distribution (also referred to as "Level 1" or "L1"). Based on the RSO operation, a measured value associated with the first programming voltage distribution is determined and compared to a predefined or preset threshold level to generate a comparison result. If the comparison result indicates that the measured value is less than the threshold level, an initial program voltage of a programming process is increased by a step or incremental value (also referred to as a "voltage step value"). If the comparison result indicates that the measured value is greater than the threshold level, the initial program voltage of the programming process is decreased by the voltage step value to establish an adjusted program voltage. Advantageously, a programming operation or process (e.g., an incremental step pulse programming operation) uses the adjusted program voltage generated in view of the measured value of the first programming voltage distribution to maintain a threshold level of programming overshoot.

In an embodiment, the measured value is a width of the first programming voltage distribution (also referred to as the "L1 width" or "L1 width value") that is compared to a threshold width level to determine the comparison result used in adjusting the program start voltage of the programming operation.

In an embodiment, the measured value is a BEC value determined based on a read sample offset operation corresponding to a read level edge of the first programming voltage distribution (also referred to as the "first programming voltage distribution edge value" or "L1 edge value"). For example, an RSO operation is performed including probes at a center offset, a left offset, a right offset, and an additional offset (herein referred to as a "program start voltage probe" or "additional probe"). In an embodiment, the program start voltage probe or the left offset probe is used to measure a BEC value of the read level edge that is compared to a threshold BEC level to determine the comparison result used in adjusting the program start voltage of the programming operation.

In an embodiment, the measured value is a slope value corresponding to the first programming voltage distribution (also referred to as the "first distribution slope value" or "L1 slope value"), wherein the measured slope value represents a change of memory cell distribution counts as a function of a threshold voltage. The slope value can be measured based on the probed values of the RSO operation. In an example, the RSO operation includes probes at a center offset, a left offset, and a right offset. In another example, the RSO operation includes the program start voltage probe. The L1 distribution slope value is measured using a set of the offset probes (e.g., the program start voltage probe and the left offset probe, the left offset probe and the center offset probe, the program start voltage probe and the center offset probe, or any combination thereof including at least two offset probe values).

Advantageously, an improved program time is achieved using the adjusted program voltage level determined based on an in situ measurement of an operating value associated with the first programming voltage distribution (e.g., a distribution width, a read level edge value, or a programming voltage distribution slope value). Furthermore, more consistent program time is realized based on the use of the adjusted program voltage level for the multiple sub-blocks associated with a wordline. Additionally, managing the program start level using a controller of the memory sub-system (e.g., outside the memory device), as compared to the use of an internal algorithm of the memory device (as in conventional approaches) enables a greater level of control and customization by a customer.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a program start voltage management component 113 to manage a program start voltage associated with a program operation based on a measured value corresponding to a programming voltage distribution of memory cells of a memory sub-system. In an embodiment, the measured value is compared to a corresponding threshold value to determine a comparison result. In an embodiment, the measured value is a width of a first programming voltage distribution (also referred to as the "first programming voltage distribution width level" or "L1 width"). The program start voltage management component 113 compares the measured L1 width to a threshold width (e.g., a target bit resolution level for a programming voltage distribution) to determine a comparison result. In an embodiment, if the comparison result indicates that the measured L1 width is less than the threshold width value, the program start voltage management component 113 increases an initial program voltage by a voltage step value to generate an adjusted program voltage level. In an embodiment, if the comparison result indicates that the measured L1 width is greater than the threshold width value, the program start voltage management component 113 decreases the initial program voltage by the voltage step value to generate the adjusted program voltage level.

In an embodiment, the program start voltage management component 113 determines a measured BEC value corresponding to a probe of a RSO operation placed on an edge of the first programming voltage distribution. In an embodiment, the RSO operation includes a left offset probe, a center offset probe, a right offset probe, and a program start voltage probe of the first programming voltage distribution. In an embodiment, the program start voltage probe can be set to a read level threshold in a range corresponding to a "high edge" of the programming voltage distribution (e.g., a range between a highest point of the first programming voltage distribution (e.g., a read level corresponding to a highest distribution count) and a position of the center offset probe). In an embodiment, the program start voltage probe can be set at a read level threshold that is within a predefined range of a read level threshold of the left offset probe (e.g., plus or minus a predefined range of values relative to the left offset). In an embodiment, the measured BEC value can correspond to the left offset probe. In an embodiment, the BEC value corresponds to an offset on a high edge of the first programming voltage distribution.

The measured BEC value is compared to a threshold BEC value to generate a comparison result. In an embodiment, if the comparison result indicates that the measured BEC value is less than the threshold BEC value, the program start voltage management component 113 increases an initial program voltage by a voltage step value to generate an adjusted program voltage level. In an embodiment, if the comparison result indicates that the measured BEC value is greater than the threshold BEC value, the program start voltage management component 113 decreases the initial program voltage by the voltage step value to generate the adjusted program voltage level.

In an embodiment, the program start voltage management component 113 determines a measured slope value corresponding to the first programming voltage distribution. The measured slope value can be determined using a set of two or more offset probes of an RSO operation including a left offset probe, a center offset probe, and a right offset probe. In an embodiment, the RSO operation further includes an additional probe (e.g., the program start voltage probe). In an embodiment, the program start voltage management component 113 calculates the slope value using a combination of two or more values corresponding to the program start voltage probe, the left offset probe, and the center offset probe.

The program start voltage management component 113 compares the measured slope value of the first programming voltage distribution to predefined slope threshold value to determine a comparison result. In an embodiment, if the comparison result indicates that the measured slope value is less than the threshold slope value, the program start voltage management component 113 increases an initial program voltage by a voltage step value to generate an adjusted program voltage level. In an embodiment, if the comparison result indicates that the measured slope value is greater than the threshold slope value, the program start voltage management component 113 decreases the initial program voltage by the voltage step value to generate the adjusted program voltage level.

In an embodiment, the adjusted program voltage level determined based on the measured value (e.g., a distribution width value, an edge level value, or a slope value) of the first programming voltage distribution is fed back and used as a start voltage in a programming process (e.g., an incremental step pulse programming process).

Figure 2:
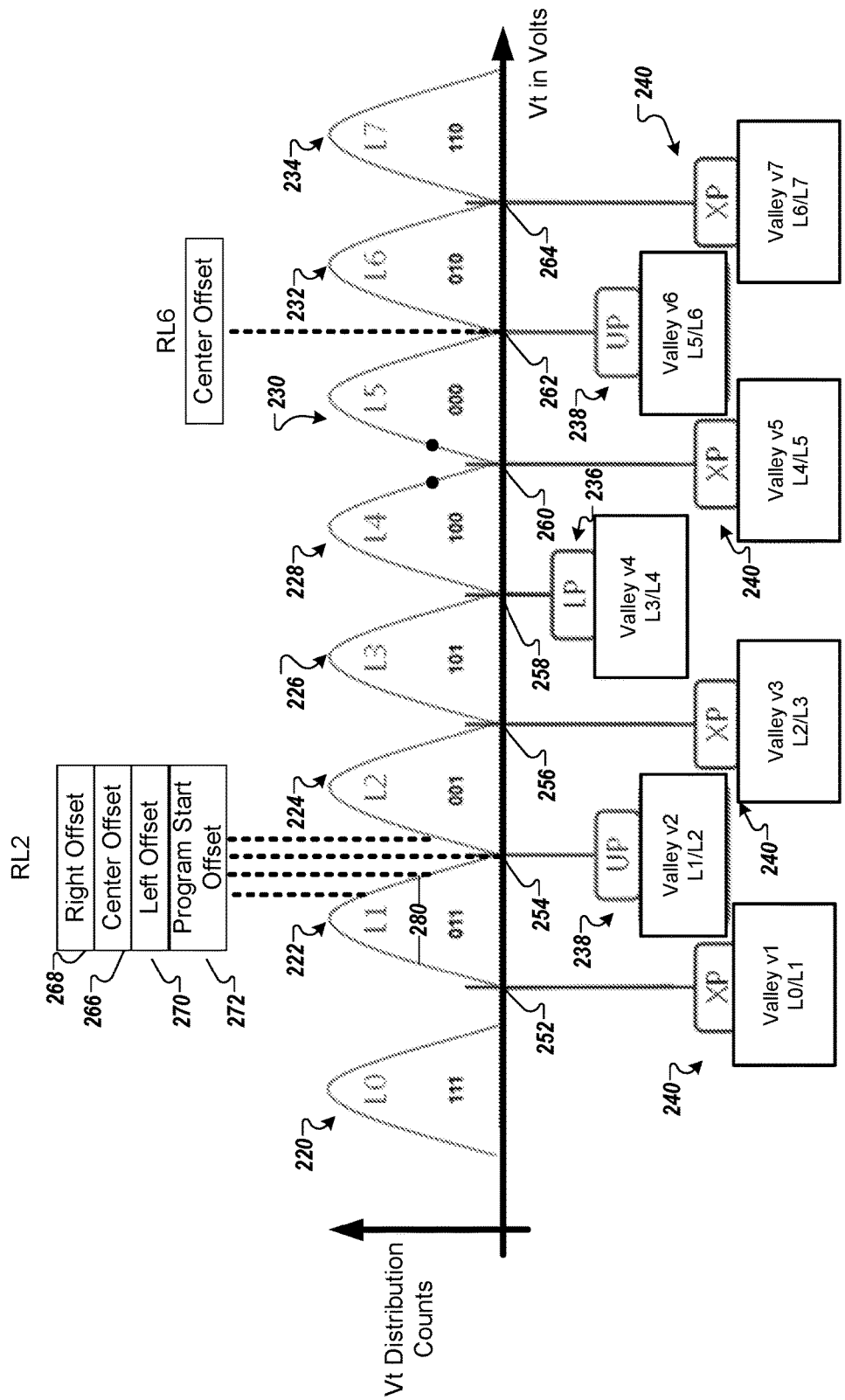
FIG. 2 illustrates example programming voltage distributions including a read sample offset operation to measure a value of a first programming voltage distribution to control a program start voltage associated with a programming process, in accordance with some embodiments of the disclosure.

FIG. 2 illustrates an example RSO operation for a read level threshold associated with a first programming voltage distribution (L1), in accordance with some embodiments of the present disclosure. In the example shown, a memory block with TLC memory cells stores TLC information using 3 bits of data per cell. As illustrated in FIG. 2, this is accomplished using eight programming voltage distributions 220-234. A lower page (LP) is defined with one read level threshold 236. An upper page (UP) is defined with two read level thresholds 238. An extra page (XP) is defined with fourth read level thresholds 240. The eight programming voltage distributions 220-234 each correspond to a level (L0:L7), each level corresponding to a value stored by the memory cell (000b:111b). Between each pair of eight programming voltage distributions is a valley, totaling seven valleys (v1:v7). A center of each programming voltage distribution 220-234 corresponds to a programming voltage (PV) target for the respective programming voltage distribution 220-232. In total, there can be seven PV targets (L1-L7) and seven read level thresholds 252-264. In addition, between pairs of adjacent programming voltage distributions there is a relative width (also referred to as "valley margin" or "margin" herein). For example, valley margins associated with a particular logical page type can indicate the relative width between pairs of programming voltage distributions associated with the particular logical page type. For instance, a first valley margin of an upper logical page (e.g., valley 2 that is between the $2^{nd}$ distribution (L1) and $3^{rd}$ distribution (L2)) that is larger than a second valley margin of the upper logical page (e.g., valley 6 that is between the sixth distribution (L5) and the seventh distribution (L6)) can indicate that the first valley is larger than the second valley (e.g., valley 2 is larger than valley 3), but does not explicitly recite the absolute width or size of either valley.

As illustrated in FIG. 2, execution of a RSO operation can include a first read operation using a center offset value 266 to obtain a center offset sample, a second read operation using a right offset value 268, a third read operation using a left offset value 270, and a fourth read operation using a program start offset value 272.

As illustrated, the RSO sampling operation of valley v2 includes the left offset probe 270 and the right offset probe 268 that are substantially equidistant from the center offset probe 266. The program start offset probe 272 can be at an additional offset value at a position along a high edge of the L1 distribution (e.g., in a range between a highest point of the L1 distribution and the center offset 266.

In an embodiment, the program start voltage management component 113 measures a value corresponding to the L1 distribution using the RSO operation. As discussed above, the measured value can be a measured distribution width 280 of the L1 distribution, a measured edge value (e.g., a BEC value at either the program start offset 272 or the left offset 270), or a measured slope of the L1 distribution (e.g., a slope measured based on two or more of the program start offset 272, the left offset 270, and the center offset 266). The measured value corresponding to the L1 distribution is compared to a corresponding threshold value to generate a comparison result (e.g., determining if a first condition is met wherein the measured value is less than the threshold value or if a second condition is met wherein the measured value is greater than the threshold value). Based on the comparison result (e.g., whether the first condition or the second condition is satisfied), an initial or default program start voltage value of a programming process (e.g., an ISPP process) is adjusted. In an embodiment, the initial program voltage is increased by a step value (e.g. a predefined voltage level) in response to satisfaction of the first condition. In an embodiment, the initial program voltage is decreased by the step value in response to satisfaction of the second condition.

Figure 3:
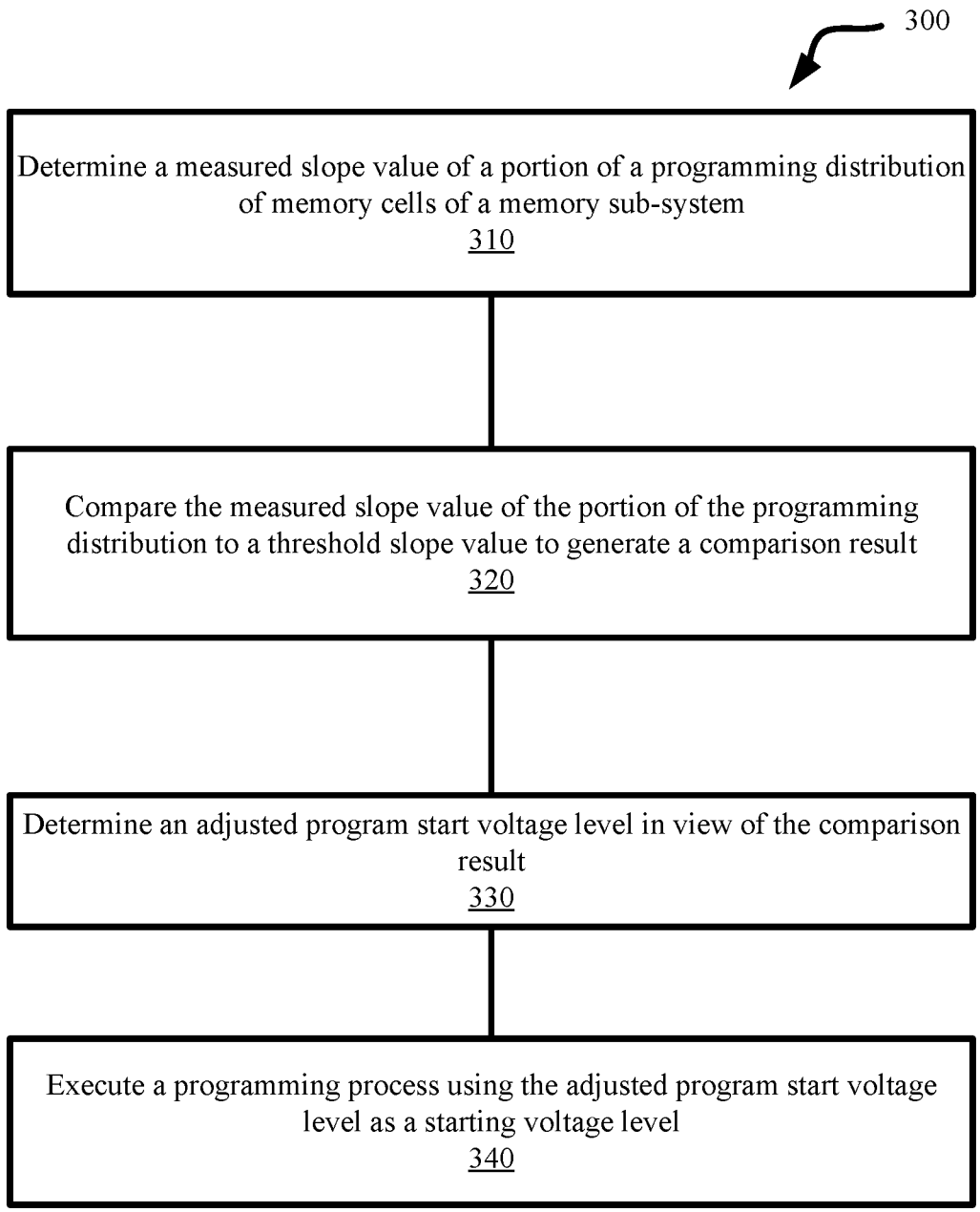
FIG. 3 is a flow diagram of an example method to execute a programming process using an adjusted program voltage determined based on a measured slope value associated with a first programming voltage distribution of memory cells of a memory sub-system, in accordance with some embodiments of the disclosure.

FIG. 3 of an example method 300 to determine an adjusted start voltage level based on a measured slope value associated with a programming voltage distribution of memory cells of a memory sub-system, in accordance with some embodiments of the disclosure. The method 300 can be performed by processing device that can include hardware (e.g., processing device, circuitry, dedicated logic, programmable logic, microcode, hardware of a device, integrated circuit, etc.), software (e.g., instructions run or executed on a processing device), or a combination thereof.

In some embodiments, the method 300 is performed by the program start voltage management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device determines a slope value of a portion of a programming voltage distribution of memory cells of a memory sub-system. In an embodiment, the measured slope value represents a change of memory cell distribution counts as a function of a threshold voltage determined based on two or more probes of an RSO operation performed at a left offset, a center offset, a right offset, and an additional offset (e.g., the program start offset of FIG. 2) applied to a first programming voltage distribution (L1). In an embodiment, the measured slope value is calculated as the difference between a first slope of the center offset and a left offset and a second slope of the left offset and the additional offset. In an embodiment, BEC values corresponding to multiple read operations performed at respective voltage level are determined. In an embodiment, the measured slope value can be calculated based on the change in the determined BEC values.

In an embodiment, the slope value can be measured based on a portion of the programming voltage distribution between two or more of the program start offset, the left offset, and the center offset. In an embodiment, the slope value can be measured for a portion of the first programming voltage distribution between the program start voltage offset probe and the left offset probe. In an embodiment, the slope value can be measured for a portion of the first programming voltage distribution between the program start voltage offset and the center offset. In an embodiment, the slope value can be measured for a portion of the first programming voltage distribution between the program start voltage offset, the left offset, and the center offset.

Figure 4:
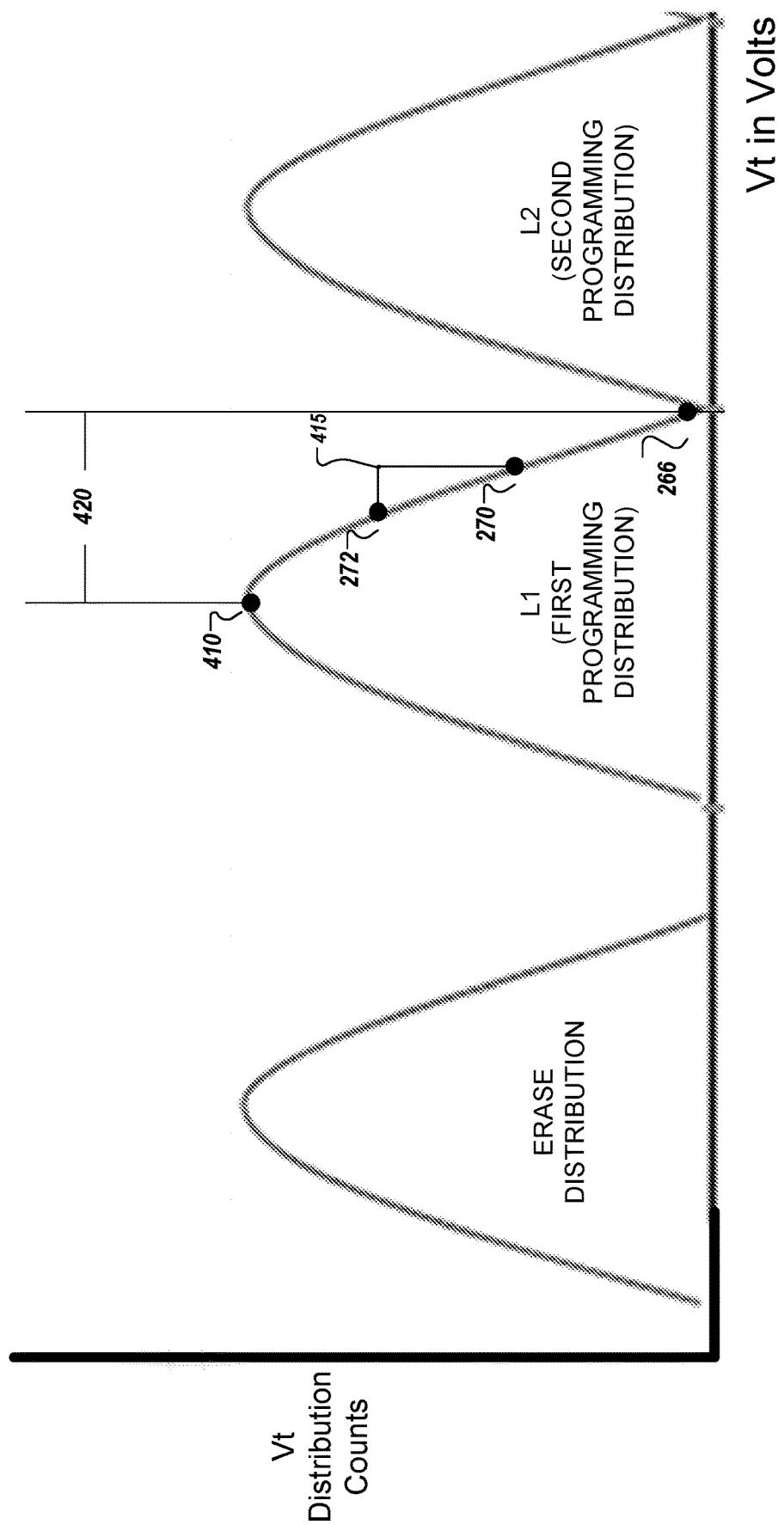
FIG. 4 illustrates example programming voltage distributions including a read sample offset operation applied to a first programming voltage distribution to determine a measured slope value, in accordance with some embodiments of the disclosure.

FIG. 4 illustrates an example first programming voltage distribution (L1) including a program start voltage offset 272, a left offset 270, and a center offset 266 of an RSO operation. As shown in FIG. 4, a high read level edge 420 corresponding to the first programming voltage distribution can be identified, in accordance with a suitable read level edge technique. As shown, the high read level edge 420 can corresponds to an edge of the first programming voltage distribution ranging from a highest distribution value 410 to the center offset 266. In an embodiment, the high read level edge 420 can include the portion of the first programming voltage distribution for which the measured slope value is determined. In the example shown in FIG. 4, the measured slope value 415 can be determined based on a portion of the first programming voltage distribution between the program start voltage offset 272 and the left offset 270.

In operation 320, the processing logic compares the measured slope value of the portion of the programming voltage distribution to a threshold slope value to generate a comparison result. In an embodiment, the comparison result indicates whether the measured slope value satisfies a first condition or a second condition. The first condition is satisfied if the measured slope value is less than the threshold slope value. The second condition is satisfied if the measured slope value is greater than the threshold slope value.

In operation 330, the processing logic determines an adjusted program voltage level in view of the comparison result. In an embodiment, if the comparison result indicates that the first condition is satisfied (i.e., the measured slope value is less than the threshold slope value), the processing logic increases an initial program start level associated with a programming process (e.g., the ISPP process) by a predefined voltage step value (e.g., 27.5 mV). In an embodiment, if the comparison result indicates that the second condition is satisfied (i.e., the measured slope value is greater than the threshold slope value), the processing logic decreases the initial program start level associated with the programming process by the voltage step value to establish the adjusted program voltage level.

In operation 340, the processing logic executes a programming process using the adjusted program voltage level as a starting voltage level. In an embodiment, the programming process can be an ISPP process (or other programming process or programming operations). Advantageously, the processing logic controls the starting voltage of the programming process (e.g., ISPP) based on a measured value (e.g., the slope value) corresponding to a first programming voltage distribution resulting from an RSO sampling operation.

Figure 5:
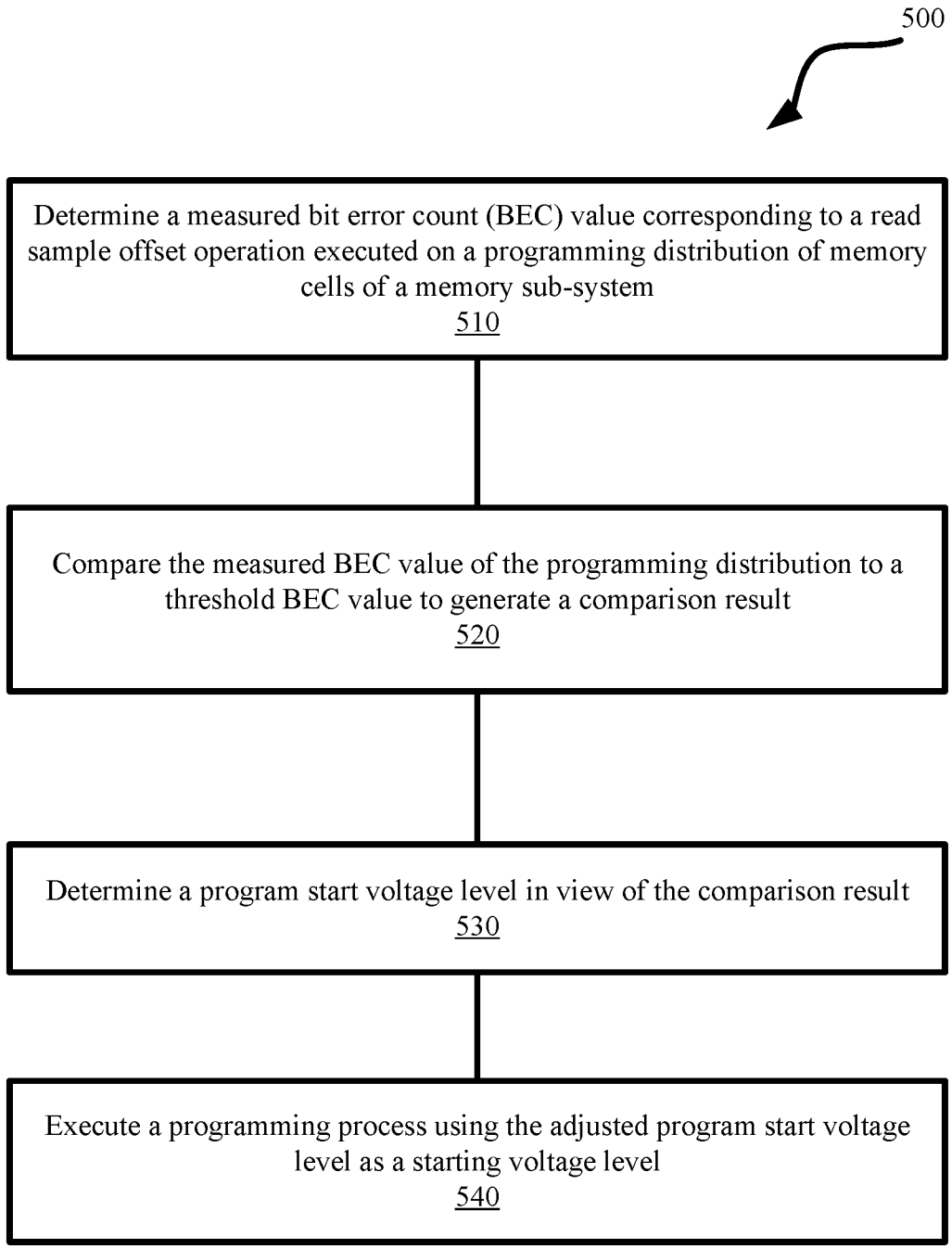
FIG. 5 is a flow diagram of an example method to execute a programming process using an adjusted program voltage determined based on a measured bit error count value associated with a first programming voltage distribution of memory cells of a memory sub-system, in accordance with some embodiments of the disclosure.

FIG. 5 of an example method 500 to determine an adjusted start voltage level based on a measured BEC value associated with a read level offset probe of a programming voltage distribution of memory cells of a memory sub-system, in accordance with some embodiments of the disclosure. The method 500 can be performed by processing device that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the program start voltage management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In operation 510, the processing logic determines a measured BEC value corresponding to a read sample offset operation executed on a programming voltage distribution of memory cells of a memory sub-system. In an embodiment, the read sample offset operation can be a program start voltage offset probe (e.g., as described above in connection with FIGS. 2-4). In an embodiment, the measured BEC value is the BEC value at the program start voltage offset. In an alternative embodiment, the measured BEC value is the BEC value at the left offset.

In operation 520, the processing logic compares the measured BEC value of the programming voltage distribution to a threshold BEC value to generate a comparison result. In an embodiment, the comparison result indicates whether the measured BEC value satisfies a first condition or a second condition. The first condition is satisfied if the measured BEC value is less than the threshold BEC value. The second condition is satisfied if the measured BEC value is greater than the threshold BEC value.

In operation 530, the processing logic determines an adjusted program voltage level in view of the comparison result. In an embodiment, if the comparison result indicates that the first condition is satisfied (i.e., the measured BEC value is less than the threshold BEC value), the processing logic increases an initial program start level associated with a programming process by a predefined voltage step value. In an embodiment, if the comparison result indicates that the second condition is satisfied (i.e., the measured BEC value is greater than the threshold BEC value), the processing logic decreases an initial program start level associated with a programming process by the voltage step value to determine the adjusted program voltage level.

In operation 540, the processing logic executes a programming process using the adjusted program voltage level as a starting voltage level. In an embodiment, the programming process can be an ISPP process (or other programming process or programming operations) for which the adjusted program voltage level is used as the starting voltage level. Advantageously, the processing logic controls the starting voltage of the programming process (e.g., ISPP) based on a measured BEC value corresponding to an RSO probe (e.g., a program start voltage probe or a left offset probe) applied to a first programming voltage distribution.

Figure 6:
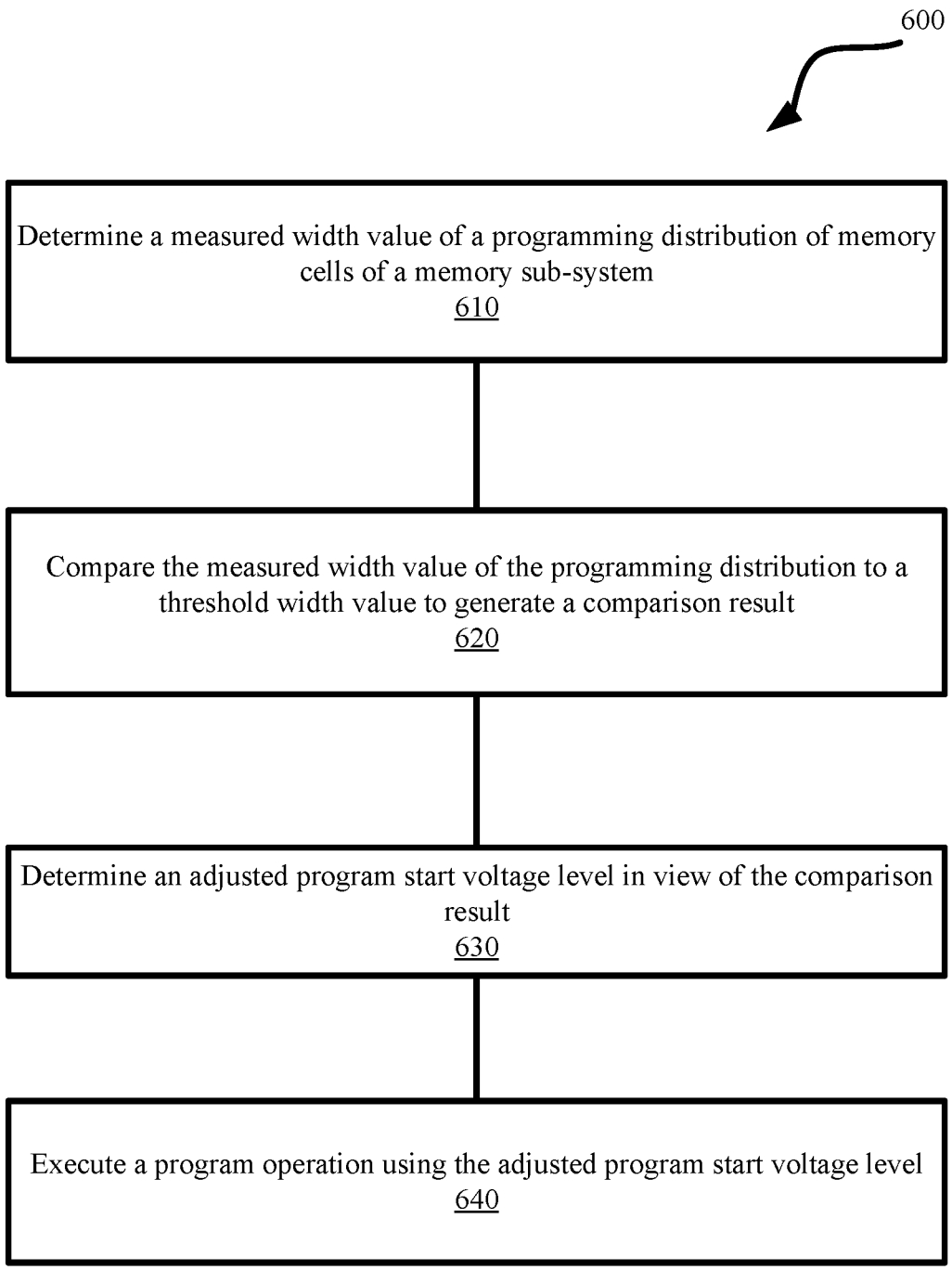
FIG. 6 is a flow diagram of an example method to execute a programming process using an adjusted program voltage determined based on a measured width value associated with a first programming voltage distribution of memory cells of a memory sub-system, in accordance with some embodiments of the disclosure.

FIG. 6 of an example method 600 to determine an adjusted start voltage level based on a measured width value of a programming voltage distribution of memory cells of a memory sub-system, in accordance with some embodiments of the disclosure. The method 600 can be performed by processing device that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the program start voltage management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In operation 610, the processing logic determines a measured width value of a programming voltage distribution of memory cells of a memory sub-system. In an embodiment, the distribution width is measure for the first programming voltage distribution. According to embodiments of the present disclosure, the measured width value of the first programming voltage distribution (e.g., L1 of FIGS. 2 and 4) of a plurality of programming voltage distribution can be determined using a suitable approach, an example of which is described below in connection with FIG. 7.

Figure 7:
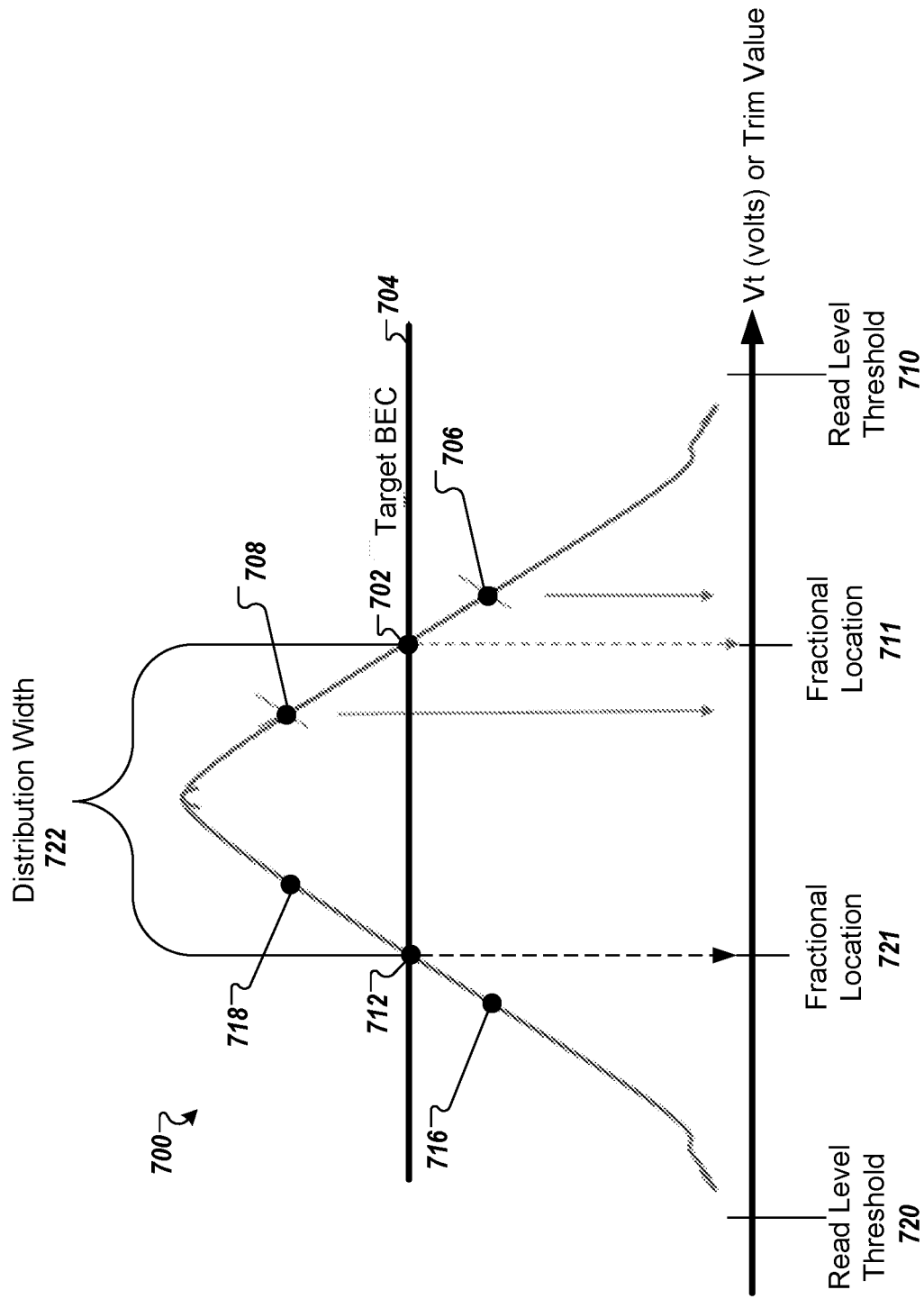
FIG. 7 illustrates locating a distribution edge of a programming voltage distribution at a target bit error count by interpolating between a first bit error count sample and a second bit error count sample, in accordance with some embodiments of the present disclosure.

FIG. 7 illustrates an example process to measure a distribution width by locating a distribution edge of a programming voltage distribution at the target BEC by interpolating between a first BEC sample and a second BEC sample, in accordance with some embodiments of the present disclosure. As shown in FIG. 7, a distribution edge 702 of a programming voltage distribution 700 (e.g., the L1 distribution) is identified at a target BEC 704 by interpolating between a first BEC sample 706 and a second BEC sample 708, in accordance with some embodiments of the present disclosure. The program start voltage management component 113 can receive a request to locate the distribution edge 702 of the programming voltage distribution 700. In response to the request, the program start voltage management component 113 measures BEC samples of the programming voltage distribution 700. The program start voltage management component 113 can start with any offset value that is offset in a first direction from a read level threshold 710. The read level threshold 710 can be considered to be at a center offset value for the respective valley. The program start voltage management component 113 reads a BEC sample at the offset value and compares the BEC sample against the target BEC 704. If the BEC sample does not meet or exceed the target BEC 704, the program start voltage management component 113 increments the offset value further in the first direction and reads another BEC sample at a further offset value and compares the other BEC sample against the target BEC 704. The program start voltage management component 113 continues incrementing the offset value until a BEC sample exceeds the target BEC 704, as illustrated as the second BEC sample 708. The program start voltage management component 113 uses the BEC sample that exceeds the target BEC 704 and the last BEC sample that did not exceed the target BEC 704, as illustrated as the first BEC sample 706, to determine the location of the first distribution edge 702. The program start voltage management component 113 determines a first location of the distribution edge 702 by interpolating the first BEC sample 706 (i.e., the last BEC sample that did not exceed the target BEC 704) and the second BEC sample 708 (i.e., the first BEC sample that does exceed the target BEC 704). By interpolating between the first BEC sample 706 and the second BEC sample 708, the program start voltage management component 113 can compute a fractional location 711 of the distribution edge 702 at the target BEC 704. The fractional location 711 can be the X-axis location of the distribution edge 702 at the target BEC 704 for the programming voltage distribution 700. The fractional location 711 can be expressed as a fractional increment location with respect to the first BEC sample 706 and the second BEC sample 708. In other embodiments, the fractional location 711 can be expressed in terms of an offset value from the read level threshold 710 or with reference to another reference point. As described herein, the fractional location 711 between the current and last read level increment is computed to improve the accuracy of the location of the distribution edge 702 at the target BEC 704. With the fractional location 711, the Vt voltage (also referred to as the total trim value) can be computed by adding a base value for a trim value of read level threshold 710 (e.g., a center value of the read level threshold 710) to the trim offset value, reflected by the fractional location 711 of the interpolated location of the distribution edge 702 at the target BEC 704, and multiplying this value by a voltage resolution (e.g., mV/step) to obtain the first location of the distribution edge 702.

In a further embodiment, the program start voltage management component 113 can locate a second distribution edge 712 of the same programming voltage distribution 700 in response to the same request or in response to a separate request. To locate the second distribution edge 712, the program start voltage management component 113 can start with any offset value that is offset in a second direction from a second read level threshold 720. The read level threshold 720 can be considered to be at a center offset value for a respective valley. The program start voltage management component 113 reads a BEC sample at the offset value and compares the BEC sample against the target BEC 704. If the BEC sample does not meet or exceed the target BEC 704, the program start voltage management component 113 increments the offset value further in the second direction and reads another BEC sample at a further offset value and compares the other BEC sample against the target BEC 704. The program start voltage management component 113 continues incrementing the offset value in the second direction until a BEC sample exceeds the target BEC 704, as illustrated as a fourth BEC sample 718. The program start voltage management component 113 takes the last BEC sample that did not exceed the target BEC 704, as illustrated as a third BEC sample 716. The program start voltage management component 113 determines a second location of the second distribution edge 712 by interpolating the third BEC sample 716 (i.e., the last BEC sample that did not exceed the target BEC 704 in the second direction) and the fourth BEC sample 718 (i.e., the first BEC sample that does exceed the target BEC 704 in the second direction). By interpolating between the third BEC sample 716 and the fourth BEC sample 718, the program start voltage management component 113 can compute a second fractional location 721 of the second distribution edge 712 at the target BEC 704. The second fractional location 721 can be the X-axis location of the second distribution edge 712 at the target BEC 704 for the programming voltage distribution 300. The fractional location 721 can be expressed as a fractional increment location with respect to the third BEC sample 716 and the fourth BEC sample 718. In other embodiments, the fractional location 721 can be expressed in terms of an offset value from the second read level threshold 720 or with reference to another reference point. As described herein, the fractional location 721 between the current and last read level increment is computed to improve the accuracy of the location of the second distribution edge 712 at the target BEC 704. With the fractional location 721, the Vt voltage (also referred to as the total trim value) can be computed by adding a second base value for a second trim value of second read level threshold 720 (e.g., a center value of the second read level threshold 320) to the trim offset value, reflected by the fractional location 721 of the interpolated location of the second distribution edge 712 at the target BEC 704, and multiplying this value by the voltage resolution (e.g., mV/step) to obtain the second location of second first distribution edge 312.

In a further embodiment, the program start voltage management component 113 can calculate a distribution width 722 of the programming voltage distribution 700 in response to the same request or in response to a separate request. For example, the program start voltage management component 113 can receive a request to locate the distribution width 722 or a request to locate a total distribution level width of all programming voltage distributions. The program start voltage management component 113 can determine the distribution width 722 using the first location of the distribution edge 702 and the second location of the second distribution edge 712. For example, the program start voltage management component 113 can calculate a difference between the fractional location 711 and the second fractional location 721. As illustrated in FIG. 7, the first location of the distribution edge 702 is a right side edge of the programming voltage distribution 700 and the second location of the distribution edge 712 is a left side edge of the programming voltage distribution 700. In other embodiments, the left side edge can be determined before the right side edge. Also, as illustrated in FIG. 7, the distribution width 722 is computed as the difference between the right and left side edges. Similarly, the program start voltage management component 113 can compute the distribution widths between the right and left side edges of each programming voltage distributions.

With reference to method 600 of FIG. 6, in operation 620, the processing logic compares the measured width value of the programming voltage distribution to a threshold width value to generate a comparison result. In an embodiment, the comparison result indicates whether the measured width value satisfies a first condition or a second condition. The first condition is satisfied if the measured width value is less than the threshold width value. The second condition is satisfied if the measured width value is greater than the threshold width value.

In operation 630, the processing logic determines an adjusted program voltage level in view of the comparison result. In an embodiment, if the comparison result indicates that the first condition is satisfied (i.e., the measured width value is less than the threshold width value), the processing logic increases an initial program start level associated with a programming process by a predefined voltage step value. In an embodiment, if the comparison result indicates that the second condition is satisfied (i.e., the measured width value is greater than the threshold width value), the processing logic decreases an initial program start level associated with a programming process by the voltage step value to determine the adjusted program voltage level.

In operation 640, the processing logic executes a programming process using the adjusted program voltage level as a starting voltage level. In an embodiment, the programming process can be an ISPP process (or other programming process or programming operations) for which the adjusted program voltage level is used as the starting voltage level. Advantageously, the processing logic controls the starting voltage of the programming process (e.g., ISPP) based on a measured width value of the first programming voltage distribution.

Figure 8:
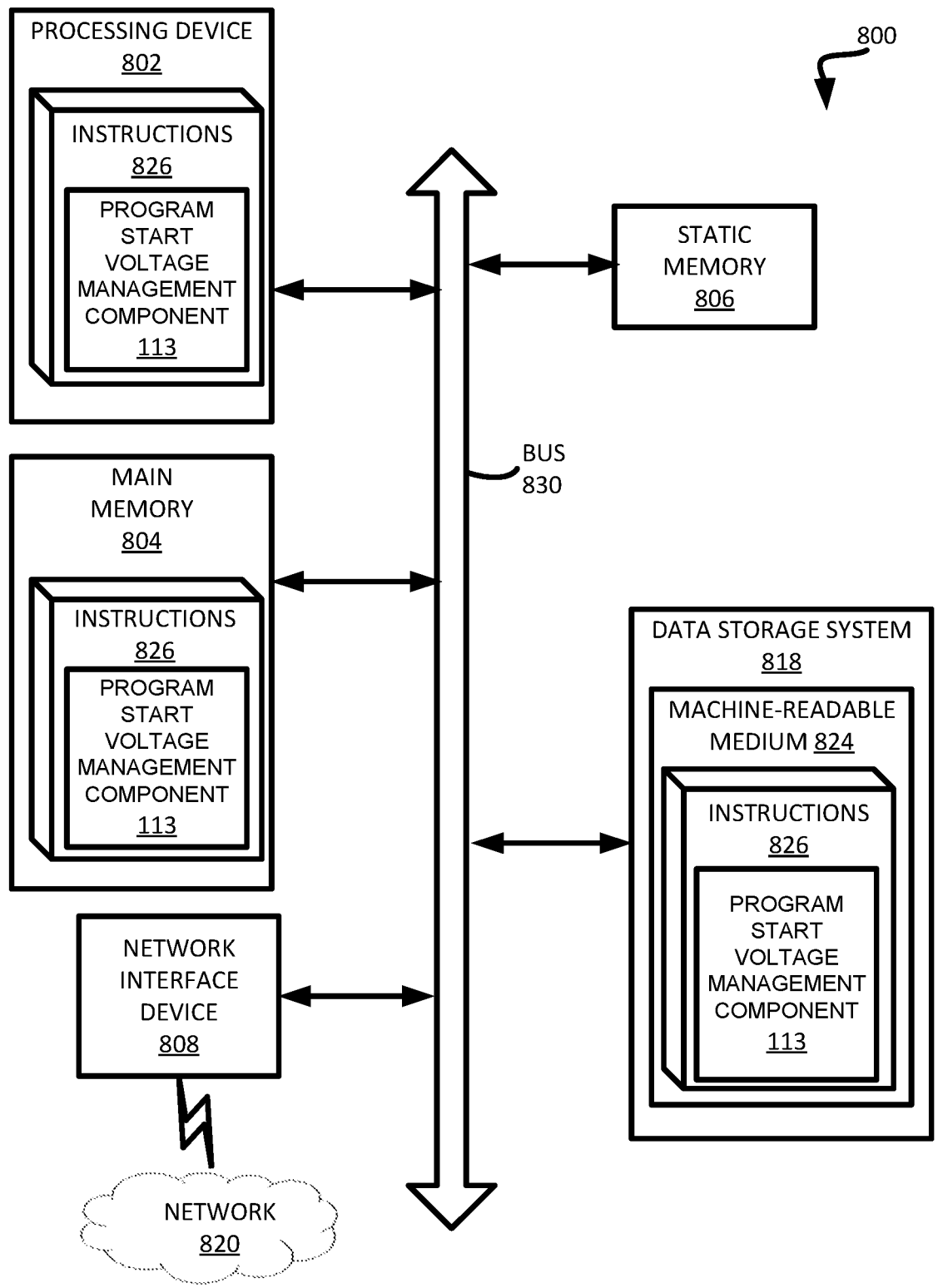
FIG. 8 illustrates an example machine of a computer system within which a set of instructions, for causing the machine to perform any one or more of the operations discussed herein, can be executed.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program start voltage management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a non-transitory computer-readable storage medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the program targeting component 113 of FIG. 1. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    determining a measured width value corresponding to a read sample offset operation executed on a first programming voltage distribution of memory cells of a plurality of programming voltage distributions of a memory sub-system;
    comparing the measured width value of the first programming voltage distribution to a threshold width value to generate a comparison result;
    in view of the comparison result, determining an adjusted program start voltage level by adjusting a default program voltage level of a programming process; and
    executing the programming process comprising a series of programming pulses, wherein the adjusted program start voltage level is set as a starting voltage level of a first programming pulse of the series of programming pulses.

2. The method of claim 1, further comprising:
    determining the comparison result indicates satisfaction of a condition wherein the measured width value is less than the threshold width value; and
    increasing an initial program voltage level by a voltage step value to determine the adjusted program start voltage level that is set as the starting voltage level.

3. The method of claim 1, further comprising:
    determining the comparison result indicates satisfaction of a condition wherein the measured width value is greater than the threshold width value; and
    decreasing an initial program voltage level by a voltage step value to determine the adjusted program start voltage level that is set as the starting voltage level.

4. The method of claim 1, wherein the read sample offset operation comprises a left offset probe, a center offset probe, a right offset probe, and an additional offset probe.

5. The method of claim 4, wherein the measured width value corresponds to a read level threshold of the additional offset probe.

6. The method of claim 4, wherein the measured width value corresponds to a read level threshold of the left offset probe.

7. The method of claim 1, wherein the programming process comprises an incremental step pulse programming process.

8. A system comprising:
    a memory device; and
    a processing device, operatively coupled with the memory device, to perform operations comprising:
        determining a measured width value corresponding to a read sample offset operation executed on a first programming voltage distribution of memory cells of a plurality of programming voltage distributions of a memory sub-system;

comparing the measured width value of the first programming voltage distribution to a threshold width value to generate a comparison result;

in view of the comparison result, determining an adjusted program start voltage level by adjusting a default program voltage level of a programming process; and executing the programming process comprising a series of programming pulses, wherein the adjusted program start voltage level is set as a starting voltage level of a first programming pulse of the series of programming pulses.

9. The system of claim 8, the operations further comprising:
determining the comparison result indicates satisfaction of a condition wherein the measured width value is less than the threshold width value; and
increasing an initial program voltage level by a voltage step value to determine the adjusted program start voltage level.

10. The system of claim 8, the operations further comprising:
determining the comparison result indicates satisfaction of a condition wherein the measured width value is greater than the threshold width value; and
decreasing an initial program voltage level by a voltage step value to determine the adjusted program start voltage level.

11. The system of claim 8, wherein the read sample offset operation comprises a left offset probe, a center offset probe, a right offset probe, and an additional offset probe.

12. The system of claim 11, wherein the measured width value corresponds to a read level threshold of the additional offset probe.

13. The system of claim 8, wherein the programming process comprises an incremental step pulse programming process.

14. A non-transitory computer-readable storage medium comprising instructions that, when executed by a processing device, cause the processing device to perform operations comprising:
determining a measured width value corresponding to a read sample offset operation executed on a first programming voltage distribution of memory cells of a plurality of programming voltage distributions of a memory sub-system;

comparing the measured width value of the first programming voltage distribution to a threshold width value to generate a comparison result;

in view of the comparison result, determining an adjusted program start voltage level by adjusting a default program voltage level of a programming process; and executing the programming process comprising a series of programming pulses, wherein the adjusted program start voltage level is set as a starting voltage level of a first programming pulse of the series of programming pulses.

15. The non-transitory computer-readable storage medium of claim 14, the operations further comprising:
determining the comparison result indicates satisfaction of a condition wherein the measured width value is less than the threshold width value; and
increasing an initial program voltage level by a voltage step value to determine the adjusted program start voltage level that is set as the starting voltage level.

16. The non-transitory computer-readable storage medium of claim 14, the operation further comprising:
determining the comparison result indicates satisfaction of a condition wherein the measured width value is greater than the threshold width value; and
decreasing an initial program voltage level by a voltage step value to determine the adjusted program start voltage level that is set as the starting voltage level.

17. The non-transitory computer-readable storage medium of claim 14, wherein the read sample offset operation comprises a left offset probe, a center offset probe, a right offset probe, and an additional offset probe.

18. The non-transitory computer-readable storage medium of claim 17, wherein the measured width value corresponds to a read level threshold of the additional offset probe.

19. The non-transitory computer-readable storage medium of claim 17, wherein the programming process comprises an incremental step pulse programming process.

20. The non-transitory computer-readable storage medium of claim 17, wherein the measured width value corresponds to a read level threshold of the left offset probe.

* * * * *